(12) United States Patent
Han

(10) Patent No.: US 9,673,424 B2
(45) Date of Patent: Jun. 6, 2017

(54) MASK FRAME ASSEMBLY, METHOD OF MANUFACTURING THE SAME, AND METHOD OF MANUFACTURING ORGANIC LIGHT-EMITTING DISPLAY DEVICE

(71) Applicant: Samsung Display Co., Ltd., Yongin (KR)

(72) Inventor: Jeongwon Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/712,577

(22) Filed: May 14, 2015

(65) Prior Publication Data

US 2016/0079568 A1    Mar. 17, 2016

(30) Foreign Application Priority Data

Sep. 17, 2014   (KR) .................. 10-2014-0123710

(51) Int. Cl.
| | |
|---|---|
| *H01L 51/56* | (2006.01) |
| *H01L 51/52* | (2006.01) |
| *C23C 18/16* | (2006.01) |
| *C25D 7/00* | (2006.01) |
| *C25D 7/04* | (2006.01) |
| *C23C 18/31* | (2006.01) |
| *C23C 14/04* | (2006.01) |

(52) U.S. Cl.
CPC ............ *H01L 51/56* (2013.01); *C23C 14/042* (2013.01); *C23C 18/1616* (2013.01); *C23C 18/31* (2013.01); *C25D 7/00* (2013.01); *C25D 7/04* (2013.01)

(58) Field of Classification Search
CPC ... H01L 51/56; H01L 51/524; C23C 18/1616; C23C 14/00; C23C 18/31; C25D 7/04; C25D 7/00
USPC .......................................................... 438/34
See application file for complete search history.

(56) References Cited

U.S. PATENT DOCUMENTS

| | | | |
|---|---|---|---|
| 2006/0103289 A1 | 5/2006 | Kim et al. | |
| 2010/0192856 A1 | 8/2010 | Sung et al. | |
| 2011/0139069 A1* | 6/2011 | Ahn ........... | C23C 14/042 |
| | | | 118/504 |

(Continued)

FOREIGN PATENT DOCUMENTS

| | | |
|---|---|---|
| JP | 2004-335382 | 11/2004 |
| KR | 10-2004-0067053 | 7/2004 |

(Continued)

*Primary Examiner* — Caleen Sullivan
(74) *Attorney, Agent, or Firm* — H.C. Park & Associates, PLC

(57) ABSTRACT

A method of manufacturing a mask frame assembly, the method including: forming a first through hole in a vicinity of a first deposition region of a first mask; forming a second through hole in a vicinity of a second deposition region of a second mask; forming a third through hole in a first portion of a supporting stick; forming a fourth through hole in a second portion of the supporting stick; aligning the first through hole with the third through hole; aligning the second through hole with the fourth through hole; inserting a fixing member in the aligned first and third through holes; and inserting the fixing member in the aligned second and fourth through holes, wherein the support stick couples the first mask and the second mask together via the fixing member.

10 Claims, 12 Drawing Sheets

(56) References Cited

U.S. PATENT DOCUMENTS

2012/0234235 A1* 9/2012 Lee ..................... C23C 14/042
                                                                                 118/504

FOREIGN PATENT DOCUMENTS

| KR | 10-2005-0053426 | 6/2005 |
| --- | --- | --- |
| KR | 10-2006-0055613 | 5/2006 |
| KR | 10-2007-0027300 | 3/2007 |
| KR | 10-2009-0053417 | 5/2009 |
| KR | 10-2009-0105614 | 10/2009 |
| KR | 10-2010-0090070 | 8/2010 |
| KR | 10-2012-0017976 | 2/2012 |
| KR | 10-2013-0005446 | 1/2013 |

* cited by examiner

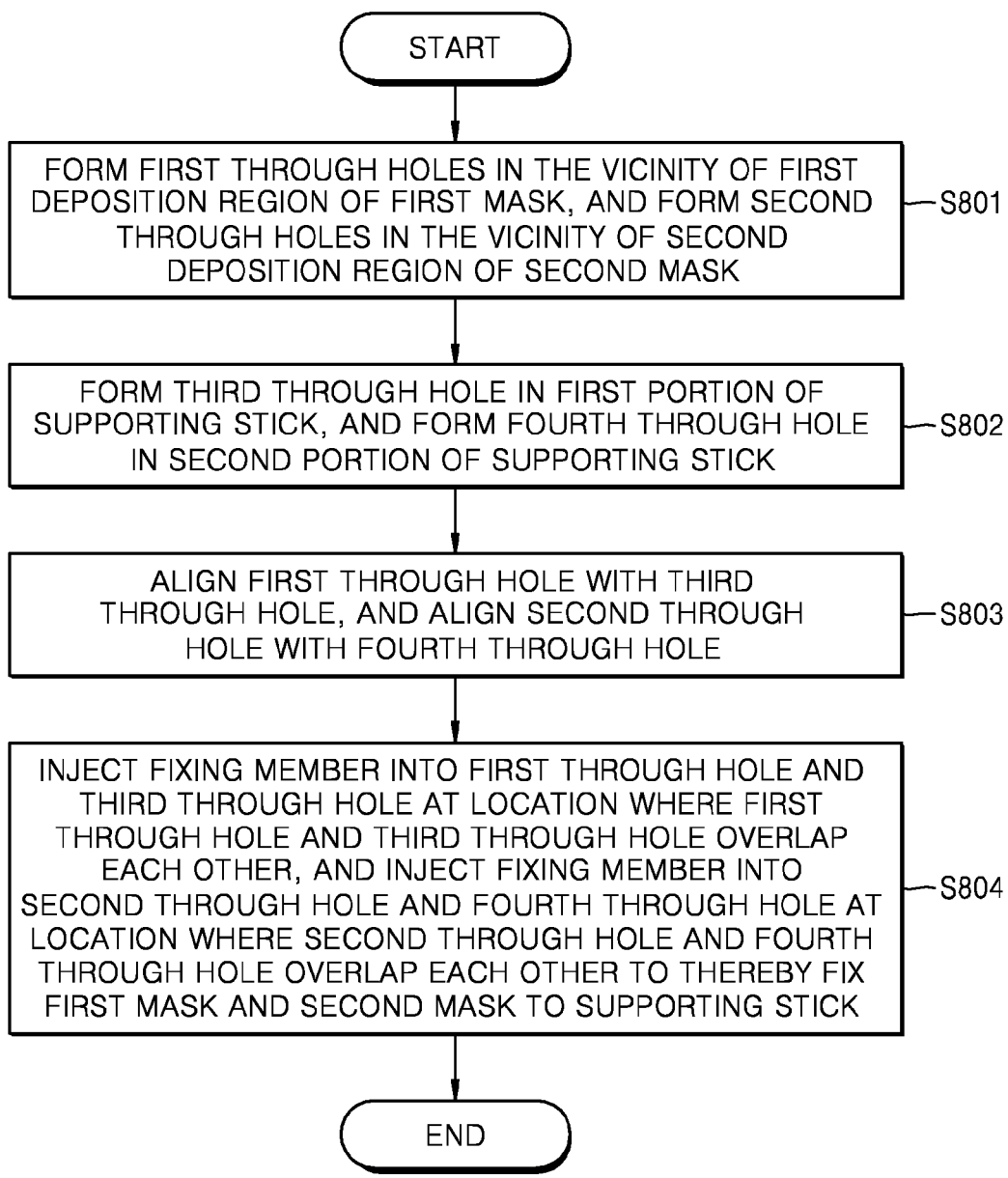

MASK FRAME ASSEMBLY, METHOD OF MANUFACTURING THE SAME, AND METHOD OF MANUFACTURING ORGANIC LIGHT-EMITTING DISPLAY DEVICE

CROSS-REFERENCE TO RELATED APPLICATION

This application claims priority from and the benefit of Korean Patent Application No. 10-2014-0123710, filed on Sep. 17, 2014, which is hereby incorporated by reference for all purposes as if fully set forth herein.

BACKGROUND

Field

Exemplary embodiments relate to a mask frame assembly, a method of manufacturing the same, and a method of manufacturing an organic light-emitting display device.

Discussion of the Background

An organic light-emitting display device is an active light emission type display device that has attracted much attention as a thin and lightweight display device having advantages, such as a wide viewing angle, good contrast, low-voltage driving, and fast response times. A light-emitting device is classified as an inorganic light-emitting device or an organic light-emitting device based on the material used to form an emission layer. Compared with the inorganic light-emitting device, the organic light-emitting device has better characteristics in terms of brightness, response times, and the like, and is capable of displaying colors without the use of color filters. As such, the organic light-emitting device has been actively developed.

In an organic light-emitting display device, an organic film and/or an electrode are formed by, for example, a vacuum deposition method. However, as the resolution of the organic light-emitting display device has increased, the width of an open slit of a mask used in a deposition process has decreased, and a degree of integration thereof has increased. In addition, to manufacture a high-resolution organic light-emitting display device, reduction or prevention of a shadow effect is desirable. Accordingly, a substrate and a mask may come into close contact with each other during the deposition process. There is a need, therefore, to improve the adhesion between the substrate and the mask.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask frame assembly, a method of manufacturing the same, and a method of manufacturing an organic light-emitting display device.

Additional aspects will be set forth in the detailed description which follows, and, in part, will be apparent from the disclosure, or may be learned by practice of the inventive concept.

An exemplary embodiment discloses a mask frame assembly, including: a frame including an opening portion; a first mask, including ends connected to the frame, the first mask including: a first deposition region disposed in correspondence with the opening portion of the frame; and a first through hole disposed in a vicinity of the first deposition region; a second mask, including ends connected to the frame, second mask including: a second deposition region disposed in correspondence with the opening portion of the frame; and a second through hole disposed in a vicinity of the second deposition regions; a supporting stick including a first portion overlapping a portion of the first mask, the first portion including a third through hole overlapping the first through hole; and a second portion overlapping a portion of the second mask, the second portion including a fourth through hole overlapping the second through hole; and a fixing member extending into the first through hole and the third through hole; and the second through hole and the fourth through.

An exemplary embodiment discloses a method of manufacturing a mask frame assembly, the method including: forming a first through hole in a vicinity of a first deposition region of a first mask; forming a second through hole in a vicinity of a second deposition region of a second mask; forming a third through hole in a first portion of a supporting stick; forming a fourth through hole in a second portion of the supporting stick; aligning the first through hole with the third through hole; aligning the second through hole with the fourth through hole; inserting a fixing member in the aligned first and third through holes; and inserting the fixing member in the aligned second and fourth through holes, wherein the support stick couples the first mask and the second mask together via the fixing member.

An exemplary embodiment also discloses a method of manufacturing an organic light-emitting display device including a first electrode facing a second electrode, and an organic film disposed on a substrate between the first electrode and the second electrode, the method including: forming the organic film and the second electrode using a mask frame assembly including: a frame including an opening portion; a first mask including ends connected to the frame, the first mask including: a first deposition region disposed in correspondence with the opening portion of the frame; and a first through hole disposed in a vicinity of the first deposition region; a second mask including ends connected to the frame, the second mask including: a second deposition region disposed in correspondence with the opening portion of the frame; and a second through hole disposed in a vicinity of the second deposition region; a supporting stick including: a first portion overlapping a portion of the first mask, the first portion including a third through hole overlapping the first through hole; and a second portion overlapping a portion of the second mask, the second portion including a fourth through hole overlapping the second through hole; and a fixing member extending into: the first through hole and the third through hole; and the second through hole and the fourth through hole.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 8 is a flowchart of a method of manufacturing the mask frame assembly of FIG. 1, according to exemplary embodiments.

DETAILED DESCRIPTION OF THE ILLUSTRATED EMBODIMENTS

Figure 1:
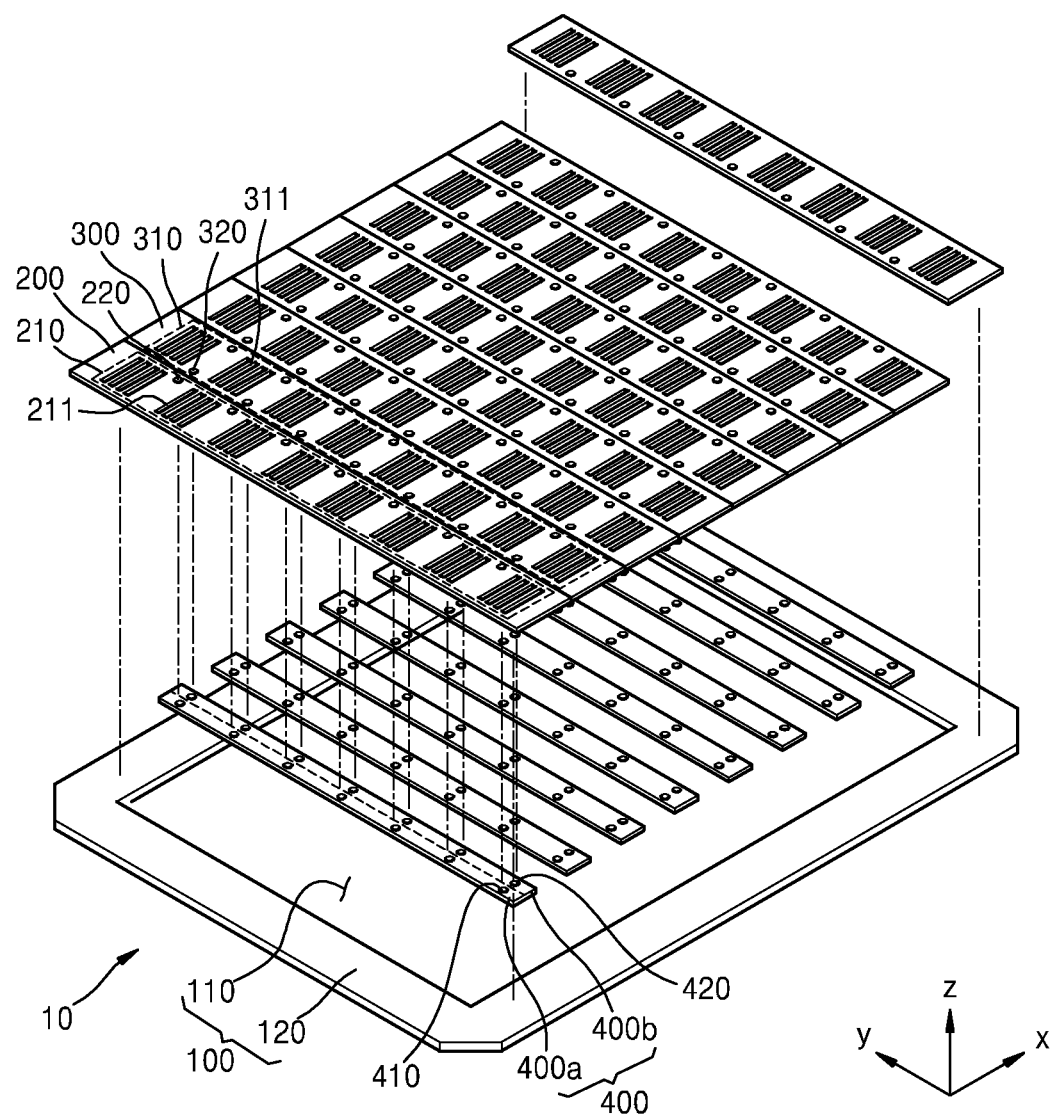
FIG. 1 is an exploded perspective view showing a mask frame assembly, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
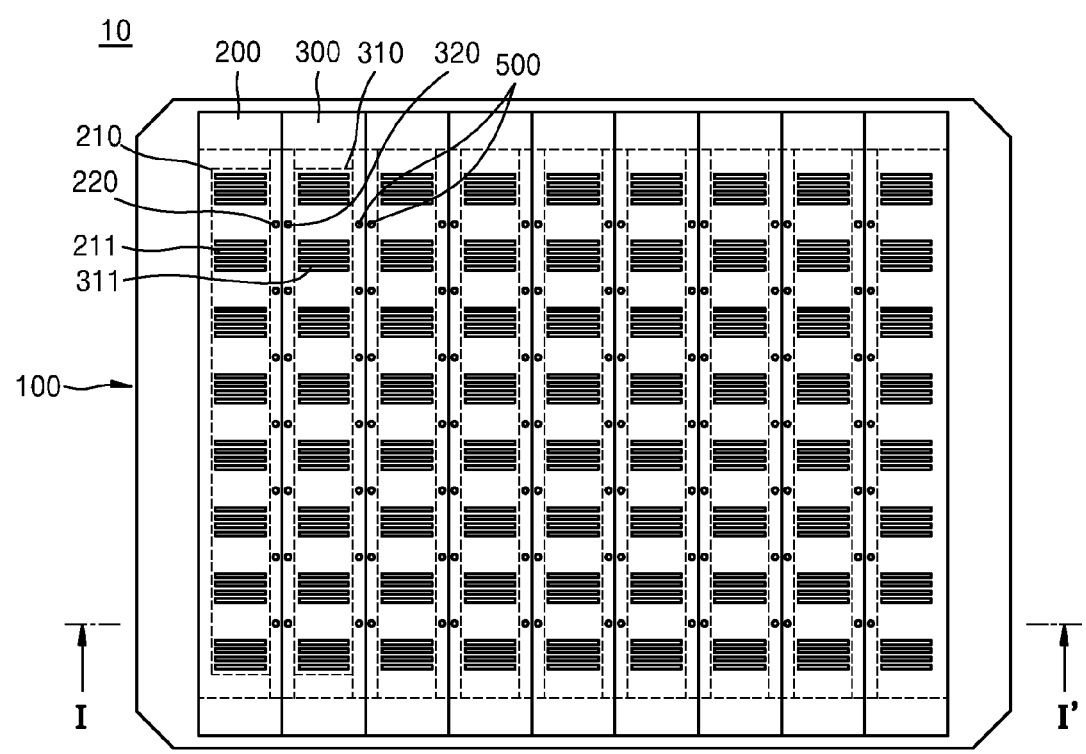
FIG. 2 is a top view of the mask frame assembly of FIG. 1, according to exemplary embodiments.

FIG. 1 is an exploded perspective view showing a mask frame assembly 10, according to exemplary embodiments, and FIG. 2 is a top view of the mask frame assembly 10 of FIG. 1, according to exemplary embodiments.

Referring to FIGS. 1 and 2, the mask frame assembly 10 may include a frame 100, a plurality of masks including a first mask 200 and a second mask 300, a supporting stick 400, and a fixing member 500.

The frame 100 is connected to the first mask 200 and the second mask 300 to support the first mask 200 and the second mask 300. The frame 100 may include an opening portion 110 through which a deposition material passes, and a supporting portion 120 formed outside the opening portion 110. The frame 100 may be formed of one of a metal, a synthetic resin, and/or the like. Although FIG. 1 shows that the frame 100 includes one opening portion 110 having a square shape, the exemplary embodiment is not limited thereto. The mask frame assembly may be formed to include two or more opening portions 110 having various shapes such as a circular shape and/or a hexagonal shape.

The supporting portion 120 is connected to the first mask 200, the second mask 300, and the supporting stick 400 to support the first mask 200, the second mask 300, and the supporting stick 400.

The first mask 200 may include a first deposition region 210 and at least one of a first through hole 220 formed in the vicinity of the first deposition region 210. The first deposition region 210 may include a plurality of first patterning slits 211. The first deposition region 210 is disposed corresponding to the opening portion 110 of the frame 100 and the deposition material that passes through the opening portion 110 may be passed through the plurality of first patterning slits 211 and be deposited on a substrate S (see substrate S of FIG. 6).

The arrangement and shapes of the first deposition region 210 and the first patterning slits 211 within the first deposition region 210 illustrated in FIGS. 1 and 2 are only examples, and the exemplary embodiment is not limited thereto. For example, the plurality of first patterning slits 211 may be consecutively disposed in a longitudinal direction (y-axis direction in FIG. 1) of the first deposition region 210, and may have form of dots instead of the form of stripes as shown in FIG. 1. In a similar manner, various modifications may be made to the arrangement and shapes of the first deposition region 210 and the first patterning slits 211.

The first mask 200 includes the first through hole 220 disposed through the first mask 200 in the vicinity of the first deposition region 210. As shown in FIG. 1, two or more of the first through holes 220 may be formed in the longitudinal direction (y-axis direction in FIG. 1) of the first mask 200. Although not shown in the drawing, a cross-section of the first through hole 220, which may be taken parallel to a plane formed by an x-axis and an y-axis, is not limited to a specific shape. The first through hole 220 may be formed to various shapes such as a polygonal shape, a circular shape, or an elliptical shape. However, for the convenience of description, the cross-section of the first through hole 220 according to the exemplary embodiments will be illustrated to have a circular shape.

Next, the second mask 300 is formed to have a shape corresponding to that of the first mask 200. For example, the second mask 300 may have the same shape as that of the first mask 200. The first mask 200 and the second mask 300 are described separately because the supporting stick 400 connects the first mask 200 and the second mask 300. The characteristics of the supporting stick 400 may further become apparent in connection with the description of the first mask 200 and the second mask 300.

The second mask 300 may include a second deposition region 310 corresponding to the first deposition region 210 of the first mask 200, and the second deposition region 310 may include a plurality of second patterning slits 311 disposed corresponding to the opening portion 110 of the frame 100. The arrangement and shapes of the second deposition region 310 and the plurality of second patterning slits 311 within the second deposition region 310 illustrated in FIGS. 1 and 2 are only examples, and the exemplary embodiment is not limited thereto. Similar to the first deposition region 210 and the plurality of first patterning slits 211 as discussed above, the second deposition region 310 and the second patterning slits 311 may have various arrangement forms and shapes.

The second mask 300 may include at least one of a second through hole 320, disposed through the second mask 300, in the vicinity of the second deposition region 310. As shown in FIG. 1, two or more of the second through holes 320 may be formed in a longitudinal direction (y-axis direction in FIG. 1) of the second mask 300. Although not shown in the drawing, a cross-section of the second through hole 320, which may be taken parallel to the plane formed by an x-axis and an y-axis, is not limited to a specific shape. The second through hole 320 may be formed to various shapes such as a polygonal shape, a circular shape, or an elliptical shape. However, for the convenience of description, the cross-section of the second through hole 320 according to the exemplary embodiments will be illustrated to have a circular shape.

The supporting stick 400 may extend in the y-axis direction, which is parallel to the first mask 200 and the second mask 300, and include a first portion 400a which overlaps at least a portion of the first mask 200, and a second portion 400b which overlaps at least a portion of the second mask 300. The first portion 400a includes at least one of a third through hole 410 which overlaps the first through hole 220, and the second portion 400b includes at least one of a fourth through hole 420 which overlaps the second through hole 320. The supporting stick 400 may be formed of the same material as that of the frame 100, but the exemplary embodiment is not limited thereto. The supporting stick 400 may be formed of a material, such as a metal and/or a synthetic resin, which generally may also be used to form the frame 100, the first mask 200, and the second mask 300.

The fixing member 500 may be disposed to pass through the first through hole 220 and the third through hole 410 connected to each other, and may be disposed to pass through the second through hole 320 and the fourth through hole 420 connected to each other. In this manner, the fixing member 500 may connect the first mask 200, the second mask 300, and the supporting stick 400, thereby affixing the first mask 200 and the second mask 300 to the supporting stick 400.

Figure 3:
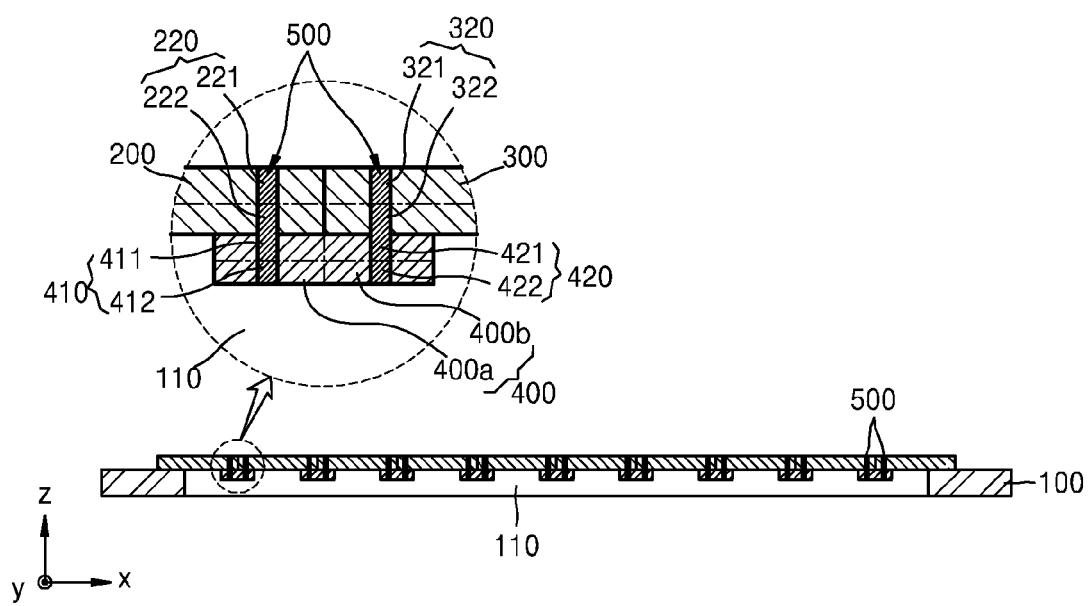
FIG. 3 is a cross-section view of the mask frame assembly taken along sectional line II-II' of FIG. 2, as well as an enlarged portion of the cross-section view, according to exemplary embodiments.

Hereinafter, reference will be made to FIG. 3 and FIGS. 4A, 4B, 4C, 4D, and 4E to describe various forms of the fixing member 500 formed in the first mask 200, the second mask 300, and the supporting stick 400. FIG. 3 is a cross-section view of the mask frame assembly 10 taken along II' of FIG. 2, as well as an enlarged portion of the cross-section view, according to exemplary embodiments, and FIGS. 4A, 4B, 4C, 4D, and 4E are partial cross-sectional views of modified examples of the fixing member of FIG. 3, according to exemplary embodiments.

Referring to FIG. 3, the first mask 200 and the second mask 300 are supported at both ends of the frame 100, and thus the first mask 200 and the second mask 300 may be alternately disposed along an x-axis direction.

The first through hole 220 includes a first opening 221 which opens in a first direction which is an upper direction of a z-axis, and a second opening 222 which opens in a second direction opposite to the first direction. Similarly, the second through hole 320 includes a first opening 321 which opens in the first direction and a second opening 322 which opens in the second direction. Referring to FIG. 3, the widths of the first openings 221 and 321 may be the same as the widths of the second openings 222 and 322. However, the widths of the first openings 221 and 321 may be different from the widths of the second openings 222 and 322, which will be further described in reference to FIGS. 4A, 4B, 4C, 4D, and 4E.

Next, the third through hole 410 and the fourth through hole 420 disposed in the supporting stick 400 will be described. The third through hole 410 includes a third opening 411 which opens in the first direction, and a fourth opening 412 which opens in the second direction. The fourth through hole 420 includes a third opening 421 which opens in the first direction and a fourth opening 422 which opens in the second direction. Referring to FIG. 3, the widths of the third openings 411 and 421 may be the same as the widths of the fourth openings 412 and 422. However, the widths of the third openings 411 and 421 may be different from the widths of the fourth openings 412 and 422, which will be further described in reference to FIGS. 4A, 4B, 4C, 4D, and 4E.

The fixing member 500 may be injected into the first openings 221 and 321, the second openings 222 and 322, the third openings 411 and 421, and the fourth openings 412 and 422, using at least one of an electroplating method and an electroless plating method. In general, the electroplating method may be performed from a temperature of 30° C. to 70° C., and the electroless plating method may be performed from a temperature of 15° C. to 100° C.

The fixing member 500 may include at least one of iron, nickel, copper, tin, gold, stainless steel (SUS), an invar alloy, an inconel alloy, a Kovar alloy, an iron alloy, a nickel alloy, a nickel-phosphorus alloy (NI—P), and a nickel-phosphorous-polytetrafluoroethylene (NI—P-PTFE) alloy.

In detail, the fixing member 500 may be disposed in the first through hole 220 and the third through hole 410, and may have a shape that entirely fills the first through hole 220 and the third through hole 410 formed through the first mask 200 and the supporting stick 400, respectively. Similarly, the fixing member 500 may also be disposed in the second through hole 320 and the fourth through hole 420, and have a shape that entirely fills the second through hole 320 and the fourth through hole 420 formed through the second mask 300 and the supporting stick 400, respectively.

The fixing member 500 may be formed to have a shape that entirely fills the first through hole 220 and the third through hole 410, but the shape of the fixing member 500 is not limited thereto. Also, the shapes of the first through hole 220, second through hole 320, third through hole 410, and the fourth through hole 420 into which the fixing member 500 is injected may be different from the shapes of the first through hole 220 to the fourth through hole 420 shown in FIG. 3.

Hereinafter, reference will be made to FIGS. 4A, 4B, 4C, 4D, and 4E to describe that the first through hole 220, second through hole 320, third through hole 410, the fourth through hole 420, and the fixing member 500 may be formed in various forms.

Figure 4A:
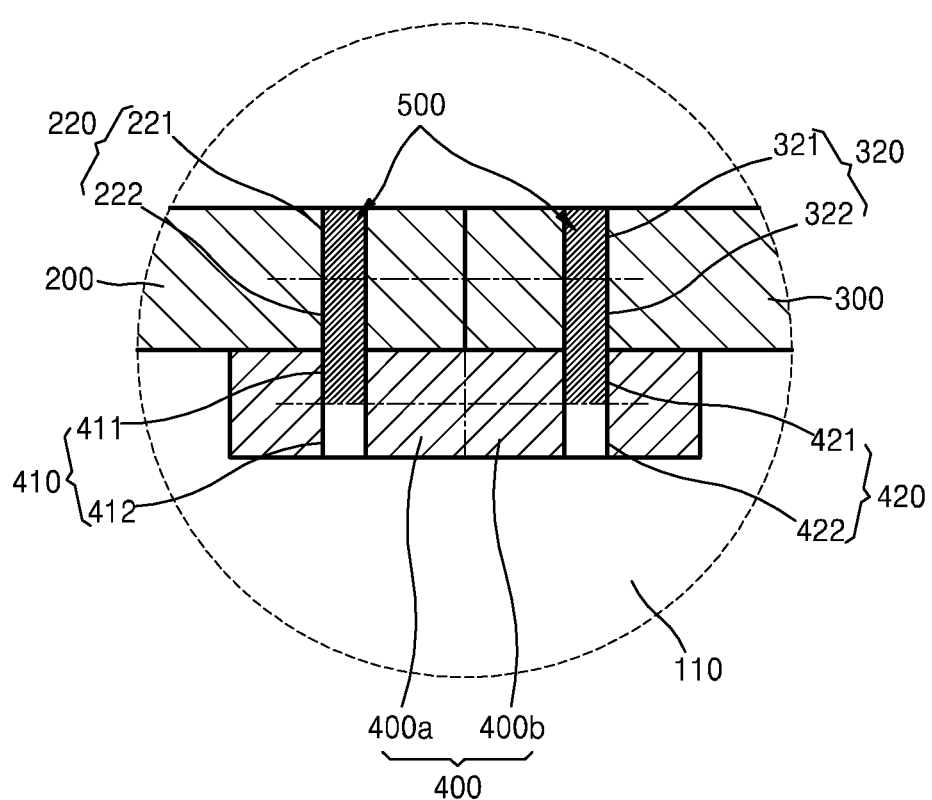
FIGS. 4A, 4B, 4C, 4D, and 4E are partial cross-sectional views of modified examples of a fixing member of FIG. 3, according to exemplary embodiments.

Referring to FIG. 4A, the shapes of the first through hole 220, second through hole 320, third through hole 410, and the fourth through hole 420 are the same as the shapes of the first through hole 220, second through hole 320, third through hole 410, and the fourth through hole 420 shown in FIG. 3. Compared to the exemplary embodiment illustrated in FIG. 3, the fixing member 500 as illustrated in FIG. 4 may be formed to partially fill the third through hole 410 and the fourth through hole 420. Friction between the surface of the fixing member 500 and the surfaces of the first through hole 220, second through hole 320, third through hole 410, and the fourth through hole 420 may be sufficient to affix the fixing member 500 to the first through hole 220, second through hole 320, third through hole 410, and the fourth through hole 420.

Figure 4B:
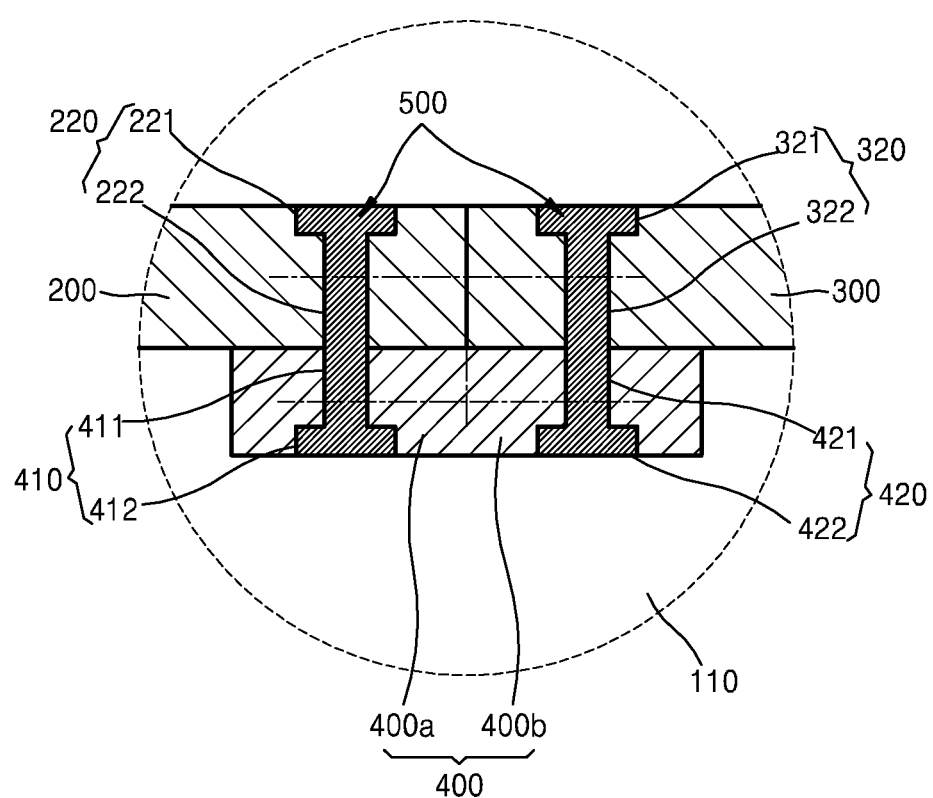

Referring to FIG. 4B, the first openings 221 and 321 of the first through hole 220 and the second through hole 320 have widths larger than the widths of the second openings 222 and 322, and the fourth openings 412 and 422 of the third through hole 410 and the fourth through hole 420 have widths which are larger than the widths of the third openings 411 and 421. The fixing member 500 may be injected into the openings of the first through hole 220, second through hole 320, third through hole 410, and the fourth through hole 420, using at least one of an electroplating method and an electroless plating method.

Figure 4C:
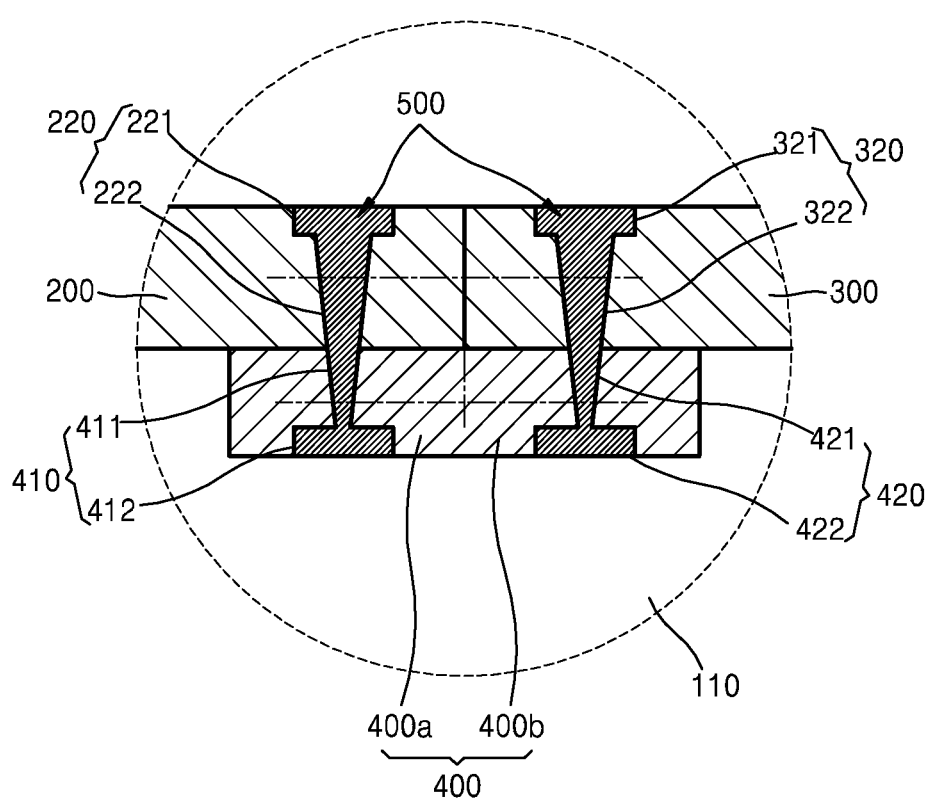
Figure 4D:
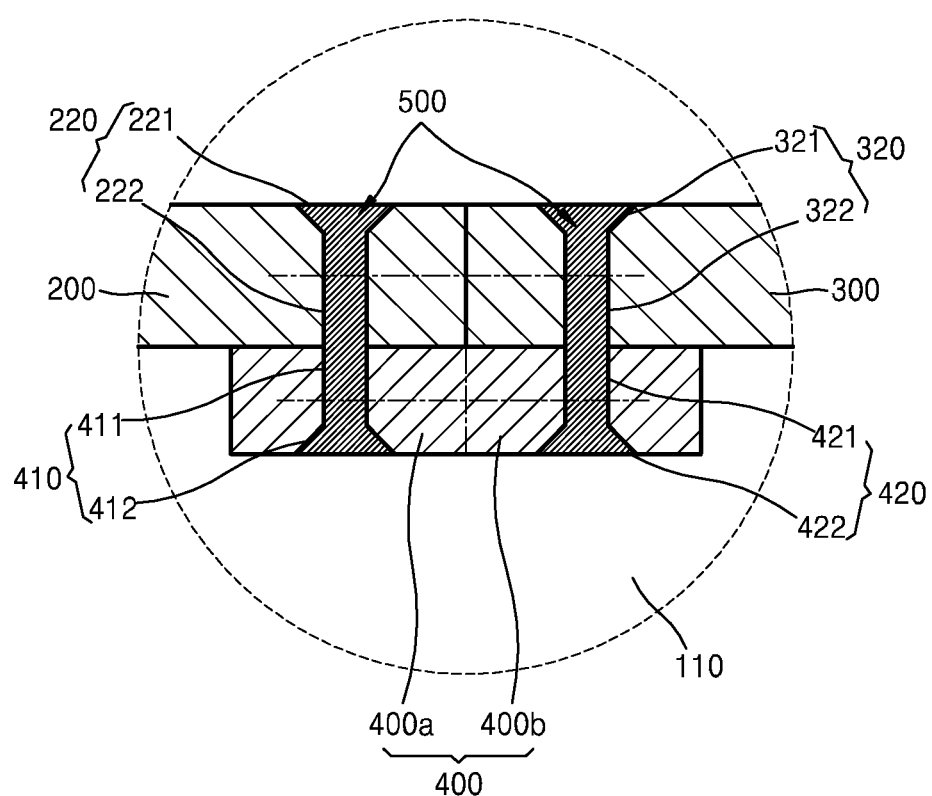

Referring to FIG. 4C, the exemplary embodiment illustrated in FIG. 4C is identical to the exemplary embodiment of FIG. 4B, except for that the first through hole 220 and the third through hole 410 are formed in a tapered shape, and the second through hole 320 and the fourth through hole 420 are formed in a tapered shape. Referring to FIG. 4D, the exemplary embodiment illustrated in FIG. 4D is identical to the exemplary embodiment of FIG. 4B, except for that the first openings 221 and 321 and the fourth openings 412 and 422 are formed to have tapered shape. The fixing member 500 may be injected into the openings of the first through hole 220, second through hole 320, third through hole 410, and the fourth through hole 420, using an electroplating method or an electroless plating method.

Figure 4E:
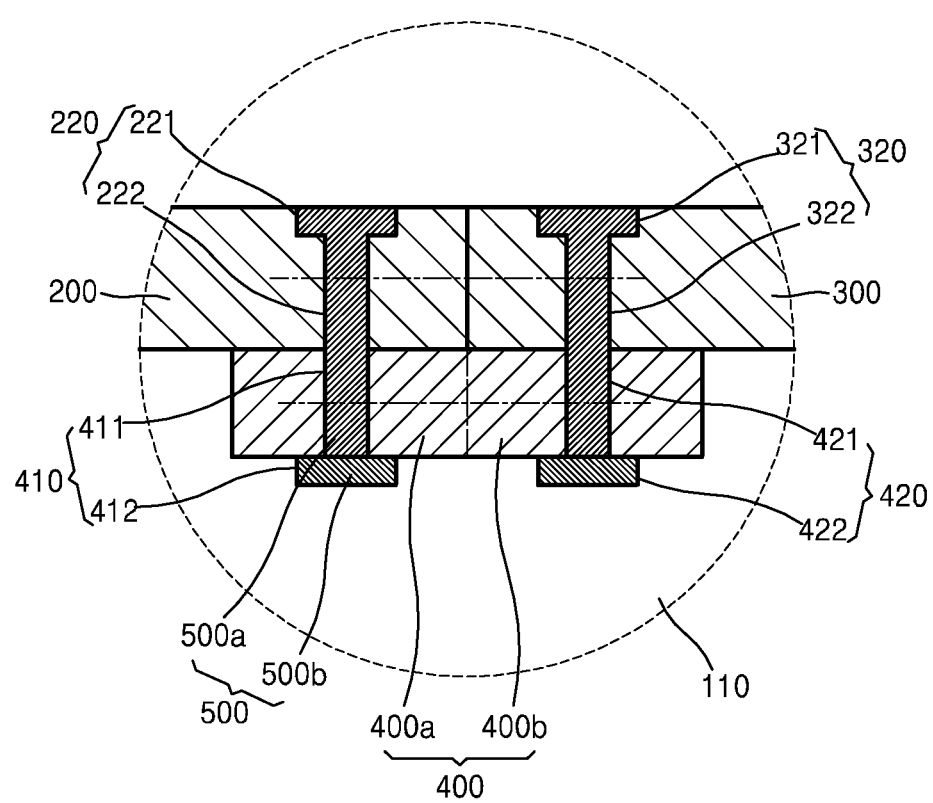

Referring to FIG. 4E, the fixing member 500 may be formed outside the first through hole 220, second through hole 320, third through hole 410, and the fourth through hole 420. More specifically, the fixing member 500 may include a first fixing member 500a formed within the first through hole 220, second through hole 320, third through hole 410, and the fourth through hole 420 and a second fixing member 500b formed outside the third through hole 410 and the fourth through hole 420, wherein the first fixing member 550a is connected to the second fixing member 500b. The exemplary embodiment is not limited thereto, and the second fixing member 500b may be formed outside the first through hole 220 and the second through hole 320 and be connected to the first fixing member 500a. In other words, the second fixing member 500b may be formed outside at least one of the first through hole 220, second through hole 320, third through hole 410, and the fourth through hole 420.

FIGS. 4A, 4B, 4C, 4D, and 4E show that the first opening 221 of the first through hole 220 has the same shape as that of the first opening 321 of the second through hole 320, but the first opening 221 of the first through hole 220 and the first opening 321 of the second through hole 320 may have different shapes. The third openings 411 and 421, and the fourth openings 412 and 422, which are respectively formed in the third through hole 410 and the fourth through hole 420, may have different shapes. In other words, the shapes of the first openings 221 and 321, the second openings 222 and 322, the third openings 411 and 421, and the fourth openings 412 and 422 are not limited to the shapes shown in FIGS. 4A, 4B, 4C, 4D, and 4E. The openings may have different widths and tapered shapes.

Figure 5:
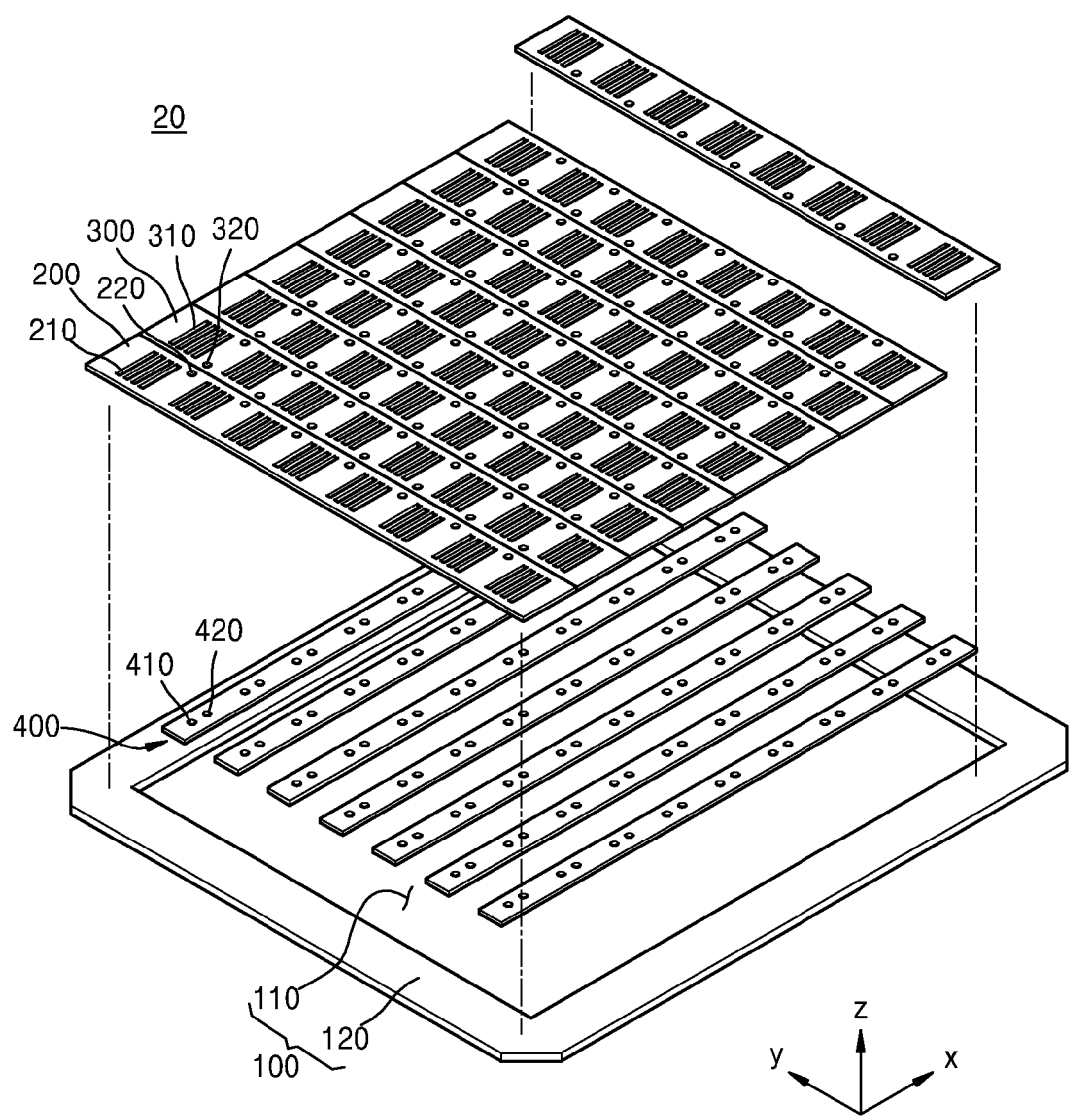
FIG. 5 is an exploded perspective view of a mask frame assembly, according to exemplary embodiments.

FIG. 5 is an exploded perspective view of a mask frame assembly 20, according to exemplary embodiments.

Referring back to FIG. 1, a supporting stick 400 may extend in the y-axis direction, which is parallel to the first mask 200 and the second mask 300, overlapping a first mask 200 and a second mask 300 in a direction parallel to the first mask 200 and the second mask 300 to support the first mask 200 and the second mask 300. Referring to FIG. 5, the supporting stick 400 may extend in the x-axis direction, which is perpendicular to the first mask 200 and the second mask 300, intersecting the first mask 200 and the second mask 300. In such case, the supporting stick 400 may support the plurality of first masks 200 and the second masks 300 which are consecutively disposed in the x-axis direction. The supporting stick 400 may include third through hole 410 and fourth through hole 420 disposed at locations respectively corresponding to first through hole 220 and second through hole 320 which are formed in the first mask 200 and the second mask 300 along a direction in which the supporting stick 400 extends.

The fixing member 500 may be injected into the first through hole 220 and the third through hole 410, the second through hole 320, and the fourth through hole 420, which are formed in this manner. The first through hole 220, second through hole 320, third through hole 410, and the fourth through hole 420 may include the first openings 221 and 321, the second openings 222 and 322, the third openings 411 and 421, and the fourth openings 412 and 422 shown in FIG. 3 and FIGS. 4A, 4B, 4C, 4D, and 4E. As described above, the first openings 221 and 321, the second openings 222 and 322, the third openings 411 and 421, and the fourth openings 412 and 422 may have various forms having various widths and tapered structures. The fixing member 500 may include a first fixing member 500a filled in a first through hole 220, second through hole 320, third through hole 410, and a fourth through hole 420, and a second fixing member 500b formed outside the first through hole 220 to the fourth through hole 420 wherein the second fixing member 550b is connected to the first fixing member 500a.

Figure 6:
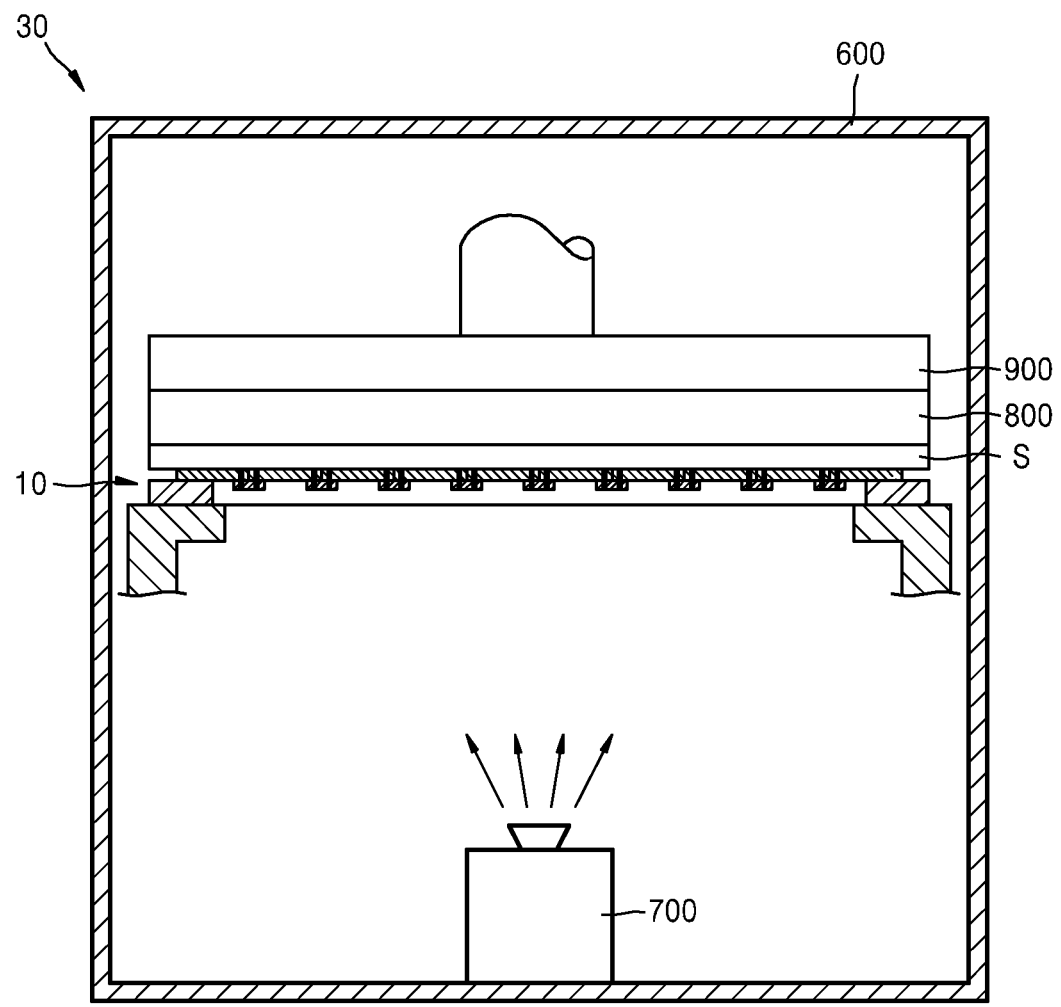
FIG. 6 is a schematic conceptual diagram of a deposition apparatus including the mask frame assembly of FIG. 1, according to exemplary embodiments.

FIG. 6 is a schematic conceptual diagram of the deposition apparatus 30 including the mask frame assembly 10 of FIG. 1, according to exemplary embodiments.

The deposition apparatus 30 includes a chamber 600 that forms a deposition processing space for a substrate S, a deposition source 700 provided within the chamber 600, the mask frame assembly 10 disposed to face the deposition source 700 of the substrate S, a magnet 900 that attracts the mask frame assembly 10 by a magnetic force and brings the mask frame assembly 10 into close contact with the substrate S, and the like. Reference numeral 800 denotes a pressurizing plate that presses the substrate S by its weight before the magnetic force of the magnet 900 attracts the substrate S and thereby reduces a gap between the mask frame assembly 10 and the substrate S.

In order to manufacture a high-resolution organic light-emitting display device, it is important to reduce or remove a shadow effect occurring during a deposition process. Therefore, it is important to prevent or restraining the mask 10 from sagging or separating from the substrate S by minimizing or reducing the gap between the substrate S and the mask 10 which come into contact with each other. Therefore, an adhesion between the substrate and the mask may be increased or reinforced.

In the related art, a mask and a support may be affixed by welding the mask to the support, in order to prevent or restrain the mask from sagging or separating and to remove or reduce the gap between each parts of the mask. However, such welding process may form a welding burr in an upper surface of the mask, and therefore, a gap may be formed between the substrate and the mask corresponding to a height of the welding burr, which results in a shadow effect. Also, when the welding burr contacts the substrate, it may result in defects such as a scratch of the substrate. Welding process may generate welding fragments, which may enter the mask and damage the mask. The heat applied during the welding process may also form internal stress in a welding point of the mask, deforming the mask and dislocating the position of a pattern on the mask. That is, the welding burr may dislocate the deposition position of an organic material during the deposition process, which may result in a decrease in pixel position accuracy (PPA).

In the mask frame assemblies 10 according to the exemplary embodiments, the fixing member 500 may be injected into the first through hole 220, the second through hole 320, the third through hole 410, and the fourth through hole 420 which are formed in the first mask 200, the second mask 300, and supporting stick 400, using an electroplating method and/or an electroless plating method, to thereby fix the first mask 200 and the second mask 300 to the supporting stick 400. The fixing member 500 fixes the first mask 200 and the second mask 300 to the supporting stick 400 using an electroplating method and/or an electroless plating method instead of using a welding method. Accordingly, unlike the welding burr formed on the surface of a mask, the fixing member may increase adhesion between the mask frame assembly 10 and the substrate S, thereby reducing a shadow effect during a deposition process. Also, since the mask frame assembly 10 is formed using an electroplating method and/or an electroless plating method, potential thermal deformation to the mask frame assembly 10 may be reduced or minimized during manufacturing. In general, an electroplating method and an electroless plating method are performed at a relatively low temperature compared to the welding process. Therefore, the internal stress to the mask may be reduced or minimized, and the thermal deformation to the mask pattern portion may be reduced or minimized.

Figure 7:
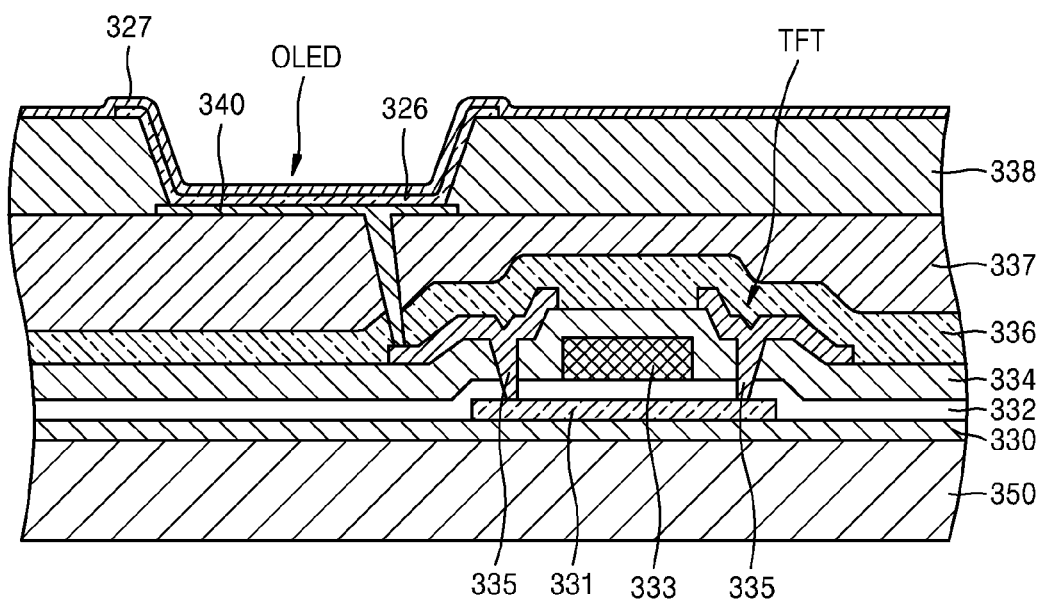
FIG. 7 is a cross-sectional view of an organic light-emitting display device manufactured using the deposition apparatus of FIG. 6, according to exemplary embodiments.

FIG. 7 is a cross-sectional view of an organic light-emitting display device which may be manufactured using the deposition apparatus 20 of FIG. 6., according to exemplary embodiments. Hereinafter, an organic light-emitting display device in which deposition is formed by the mask frame assembly 10 will be described with reference to FIGS. 6 and 7.

A buffer layer 330 is formed on a substrate 350, and a TFT is provided on the buffer layer 330. The TFT includes a semiconductor active layer 331, a gate insulating film 332 which is formed to cover the active layer 331, and a gate electrode 333 formed on the gate insulating film 332. An interlayer insulating film 334 is formed to cover the gate electrode 333, and a source and drain electrode 335 is formed on the interlayer insulating film 334.

The source and drain electrode 335 contacts with a source region and a drain region of the active layer 331 through contact holes formed in the gate insulating film 332 and the interlayer insulating film 334. An electrode insulating film 336 is disposed on the interlayer insulating film 334, covering the source and drain electrode 335, and a planarization film 337 is disposed on the electrode insulating film 336.

A first electrode layer 340 serving as an anode electrode of an organic light-emitting element (OLED) is connected to the source and drain electrode 335. The first electrode layer 340 is formed on the planarization film 337, and a pixel defining film 338 is formed to cover the first electrode layer 340. After a predetermined opening portion is formed in the pixel defining film 338, an organic light-emitting layer 326 of the organic light-emitting element (OLED) is formed, and a second electrode layer 327 as a common electrode is deposited thereon and the pixel defining film 338.

When the exemplary embodiments of the mask frame assembly 10 are used at the time of a deposition process, adhesion between the substrate S and the mask frame assembly 10 is increased, thereby allowing a precise pattern to be obtained.

FIG. 8 is a flow chart of a method of manufacturing the mask frame assembly 10 of FIG. 1, according to exemplary embodiments.

The first through hole 220 are formed in the vicinity of the first deposition region 210 of the first mask 200, and the second through hole 320 are formed in the vicinity of the second deposition region 310 of the second mask 300 (operation S801).

The third through hole 410 is formed in the first portion 400a of the supporting stick 400, and the fourth through hole 420 is formed in the second portion 400b of the supporting stick 400 (operation S802).

The first through hole 220, the second through hole 320, the third through hole 410, and the fourth through hole 420 may be formed at the time of manufacturing the first mask 200 and the second mask 300 by using a casting method or an electroplating method which may be used to manufacture the first mask 200 and the second mask 300. In addition, the first mask 200 and the second mask 300 may be manufactured and are molded to form the first through hole 220, the second through hole 320, the third through hole 410, and the fourth through hole 420.

Next, the first through hole 220 and the third through hole 410 are aligned, and the second through hole 320 and the fourth through hole 420 are aligned (operation S803).

Finally, the fixing member 500 is injected into the first through hole 220 and the third through hole 410 overlapping each other, and the fixing member 500 is injected into the second through hole 320 and the fourth through hole 420 overlapping each other to thereby affixing the first mask 200 and the second mask 300 to the supporting stick 400 (operation S804).

As described above, according to the above exemplary embodiments, a mask frame assembly, a method of manufacturing the same, and a method of manufacturing an organic light-emitting display device may minimize or reduce the gap between a substrate and a mask and reducing thermal deformation of the mask, which allows an organic light-emitting element to be precisely formed on the substrate.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a mask frame assembly, the method comprising:
   forming a first through hole in a vicinity of a first deposition region of a first mask;
   forming a second through hole in a vicinity of a second deposition region of a second mask;
   forming a third through hole in a first portion of a supporting stick;
   forming a fourth through hole in a second portion of the supporting stick;
   aligning the first through hole with the third through hole;
   aligning the second through hole with the fourth through hole;
   inserting a fixing member in the aligned first and third through holes; and
   inserting the fixing member in the aligned second and fourth through holes,
   wherein the supporting stick couples the first mask and the second mask together via the fixing member.

2. The method of claim 1, wherein:
   at least one of the first through hole and the second through hole comprises:
      a first opening that is open in a first direction facing a deposition source; and
      a second opening that is open in a second direction opposite the first direction; and
   widths of the first opening and the second opening are different from one another.

3. The method of claim 2, wherein the width of the first opening is larger than the width of the second opening.

4. The method of claim 1, wherein:
   at least one of the third through hole and the fourth through hole comprises:
      a third opening that is open in a first direction facing a deposition source; and
      a fourth opening that is open in a second direction opposite the first direction; and
   widths of the third opening and the fourth opening are different from one another.

5. The method of claim 4, wherein the width of the fourth opening is larger than the width of the third opening.

6. The method of claim 1, wherein the fixing member comprises:
   a first fixing member extending into the first through hole, the second through hole, the third through hole, and the fourth through hole; and
   a second fixing member connected to the first fixing member, the second fixing member disposed outside at least one of the first through hole, the second through hole, the third through hole, and the fourth through hole.

7. The method of claim 1, wherein at least one of the first through hole, the second through hole, the third through hole, and the fourth through hole comprises a tapered portion.

8. The method of claim 1, wherein the fixing member is an electroplated and/or electroless plated formation.

9. The method of claim 1, wherein the fixing member comprises at least one of iron, nickel, copper, tin, gold, stainless steel, an invar alloy, an inconel alloy, a Kovar alloy, an iron alloy, and a nickel alloy.

10. The method of claim 1, wherein inserting the fixing member comprises:
    injecting the fixing member into the first through hole and the second through hole and into the second through hole and the fourth through hole from a temperature of 15° C. to 100° C.

* * * * *